United States Patent
Nishikawa et al.

(10) Patent No.: US 11,180,032 B2
(45) Date of Patent: Nov. 23, 2021

(54) MONITORING DEVICE AND POWER STORAGE SYSTEM

(71) Applicant: SANYO Electric Co., Ltd., Daito (JP)

(72) Inventors: Masato Nishikawa, Hyogo (JP); Kimihiko Furukawa, Hyogo (JP); Hidetsugu Mukae, Hyogo (JP); Shinya Inui, Hyogo (JP); Tomonori Kawamoto, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 273 days.

(21) Appl. No.: 16/488,436

(22) PCT Filed: Mar. 15, 2018

(86) PCT No.: PCT/JP2018/010117
§ 371 (c)(1),
(2) Date: Aug. 23, 2019

(87) PCT Pub. No.: WO2018/180520
PCT Pub. Date: Oct. 4, 2018

(65) Prior Publication Data
US 2020/0003842 A1     Jan. 2, 2020

(30) Foreign Application Priority Data
Mar. 31, 2017   (JP) .............................. JP2017-072277

(51) Int. Cl.
*G01R 31/3835*   (2019.01)
*B60L 3/00*   (2019.01)
(Continued)

(52) U.S. Cl.
CPC ............. *B60L 3/0046* (2013.01); *B60L 50/60* (2019.02); *B60L 58/14* (2019.02); *B60L 58/15* (2019.02);
(Continued)

(58) Field of Classification Search
CPC ........ B60L 3/0046; B60L 50/60; B60L 58/15; B60L 58/14; B60L 58/12; B60L 3/00;
(Continued)

(56) References Cited

U.S. PATENT DOCUMENTS 9,748,777 B2 *   8/2017   Owen ................... H02J 7/0021
10,761,530 B2 *   9/2020   Uppalapati ........... H02J 7/0029
(Continued)

FOREIGN PATENT DOCUMENTS

EP   1619510 A2 *   1/2006   ........... G01R 31/006
JP   11-176480 A   7/1999
(Continued)

OTHER PUBLICATIONS

International Search Report dated Apr. 17, 2018, issued in counterpart International Application No. PCT/JP2018/010117 (2 pages).

*Primary Examiner* — Tung S Lau
(74) *Attorney, Agent, or Firm* — Westerman, Hattori, Daniels & Adrian, LLP (57) ABSTRACT

A monitoring device includes a first detection block, a second detection block, and a monitoring unit. Each of the first detection block and the second detection block includes one or more voltage detectors that detect voltages across power storage cells. The monitoring unit includes a complement processor that, when a circuit in the first detection block breaks down and the first detection block fails to transmit the states of the power storage cells to the monitoring unit, complements the states of the power storage
(Continued)

cells that have not been acquired from the first detection block, based on the states of the power storage cells detected in the second detection block.

9 Claims, 9 Drawing Sheets

(51) Int. Cl.
    *G01R 31/396*     (2019.01)
    *G01R 31/36*     (2020.01)
    *H01M 10/48*     (2006.01)
    *B60L 50/60*     (2019.01)
    *B60L 58/15*     (2019.01)
    *B60L 58/14*     (2019.01)
    *B60L 58/12*     (2019.01)

(52) U.S. Cl.
    CPC ..... *G01R 31/3648* (2013.01); *G01R 31/3835* (2019.01); *G01R 31/396* (2019.01); *H01M 10/482* (2013.01); *B60L 58/12* (2019.02)

(58) Field of Classification Search
    CPC .............. G01R 31/396; G01R 31/3835; G01R 31/3648; G01R 19/16542; G01R 31/392; H01M 10/482; H01M 10/48; H01M 2010/4271; H01M 10/425; Y02E 60/10
    See application file for complete search history.

(56) References Cited

U.S. PATENT DOCUMENTS

| | | | | |
|---|---|---|---|---|
| 10,814,742 | B2 * | 10/2020 | Anderson | G01R 31/3842 |
| 2014/0239900 | A1 | 8/2014 | Abe et al. | |
| 2015/0291039 | A1 * | 10/2015 | Sakata | H01M 10/482 |
| | | | | 307/10.1 |
| 2017/0317508 | A1 * | 11/2017 | Owen | B60L 50/51 |

FOREIGN PATENT DOCUMENTS

| | | | | | |
|---|---|---|---|---|---|
| JP | 11176480 | A | * | 7/1999 | ......... Y02T 10/7005 |
| JP | 2000-357541 | A | | 12/2000 | |
| JP | 2003-134683 | | * | 5/2003 | ............... H02J 7/00 |
| JP | 2003-134683 | A | | 5/2003 | |
| JP | 2004-526282 | A | * | 8/2004 | ............ H01M 10/48 |
| JP | 2010-81692 | A | | 4/2010 | |
| JP | 2011/108025 | A1 | * | 6/2013 | ............ H01M 10/441 |
| JP | 2014-184869 | A | * | 10/2014 | ............. B60L 3/0092 |
| JP | 2015-53825 | A | * | 3/2015 | ............. Y02T 10/70 |
| JP | 2016-16763 | | * | 2/2016 | ............. B60W 10/06 |
| JP | 2016-226110 | A | | 12/2016 | |
| JP | 2016226110 | A | * | 12/2016 | ......... Y02T 10/7005 |
| WO | 2013/054672 | A1 | | 4/2013 | |
| WO | WO 2014/068917 | A1 | * | 5/2014 | ............... H02J 7/00 |

* cited by examiner

| Voltage detector A1 failure | Voltage detector A2 failure | Voltage detector A3 failure | Voltage detector A4 failure | Voltage abnormality in complement process | Determination result |
|---|---|---|---|---|---|
| X |   |   |   |   | Continue to run (with output restricted) |
|   | X |   |   |   | Continue to run (with output restricted) |
| X | X |   |   |   | Continue to run (with output restricted) |
|   |   | X |   |   | Continue to run (with output restricted) |
|   |   |   | X |   | Continue to run (with output restricted) |
|   |   | X | X |   | Continue to run (with output restricted) |
| X |   |   |   | X | Relay open |
|   | X |   |   | X | Relay open |
| X | X |   |   | X | Relay open |
|   |   | X |   | X | Relay open |
|   |   |   | X | X | Relay open |
|   |   | X | X | X | Relay open |
| X |   | X |   | (X) | Relay open |
|   | X |   | X | (X) | Relay open |
| X | X | X |   | (X) | Relay open |
|   | X | X |   | (X) | Relay open |
| X |   |   | X | (X) | Relay open |
|   | X | X | X | (X) | Relay open |
| X | X | X | X | (X) | Relay open |

FIG. 9

MONITORING DEVICE AND POWER STORAGE SYSTEM

TECHNICAL FIELD

The present invention relates to a monitoring device and a power storage system, both of which monitor a power storage unit mounted in a vehicle.

BACKGROUND ART

PTL 1 discloses a power supply device that includes a power storage unit and a plurality of detection circuits. The power storage unit has a plurality of batteries connected in series to supply electric power to a motor that makes a vehicle run. The power storage unit is divided into a plurality of battery blocks, and the plurality of detection circuits each detect a state of the corresponding battery block. The detection circuits operate by means of electric power supplied from the corresponding battery blocks. In this power supply device, the detection circuits are connected to respective equalization circuits, which equalize load currents of the battery blocks at predetermined current values. With this equalization circuits, the constant load currents flow through the battery blocks that activate the detection circuits. Each of the detection circuits detects a voltage, temperature, and remaining battery capacity of a corresponding battery block and then transmits detected information to a vehicle-side electronic control unit (ECU) via a communication circuit. The vehicle-side ECU makes a calculation by using the information received from the power supply device and signals from an accelerator and a brake and controls charging or discharging of the power storage unit.

CITATION LIST

Patent Literature

PTL 1: Unexamined Japanese Patent Publication No. 2010-81692

SUMMARY OF THE INVENTION

Technical Problem

In the power supply device described in PTL 1, if at least one of the detection circuits breaks down and thus fails to transmit the information on a corresponding battery block to the vehicle-side ECU, the vehicle-side ECU cannot grasp the state of the power storage unit, which may cause the vehicle to stop running.

Even if some of the detection circuits that detect the states of the power storage units break down, it is likely that the power storage unit operates properly and the vehicle can continue to run. In such cases, although the power storage unit is not sufficiently monitored, it has been desired to enhance running continuity (=vehicle operation endurance) of the vehicle with an operation of a drive motor restricted.

An object of the present invention that has been made in consideration of the above situation is to provide a monitoring device and a power storage system, both of which can monitor a state of a power storage unit and enhance running continuity (=vehicle operation endurance) of a vehicle.

Solution to Problem

A monitoring device according to an aspect of the present invention includes a first detection block, a second detection block, and a monitoring unit. Each of the first detection block and the second detection block includes one or more state detectors that detect states of power storage cells inside a power storage unit mounted in a vehicle. The monitoring unit acquires the states of the power storage cells detected in each of the first detection block and the second detection block. The monitoring unit includes a complement processor that, when a circuit in the first detection block breaks down and the first detection block fails to transmit the states of the power storage cells to the monitoring unit, complements the states of the power storage cells that have not been acquired from the first detection block, based on the states of the power storage cells detected in the second detection block.

Advantageous Effect of Invention

According to the present invention, it is possible to monitor a state of a power storage unit and enhance running continuity (=vehicle operation endurance) of a vehicle.

DESCRIPTION OF EMBODIMENT

With reference to FIGS. 1 to 9, the present invention will be described below based on the preferred exemplary embodiment. The identical reference marks are assigned to the same or equivalent components and members illustrated in the drawings. Explanation for the same or equivalent components and members will not be repeated as appropriate. Members are illustrated in each figure on an appropriately larger or smaller scale in order to facilitate understanding. Some members that are not important in explaining the exemplary embodiment are not illustrated in the figures.

Figure 1:
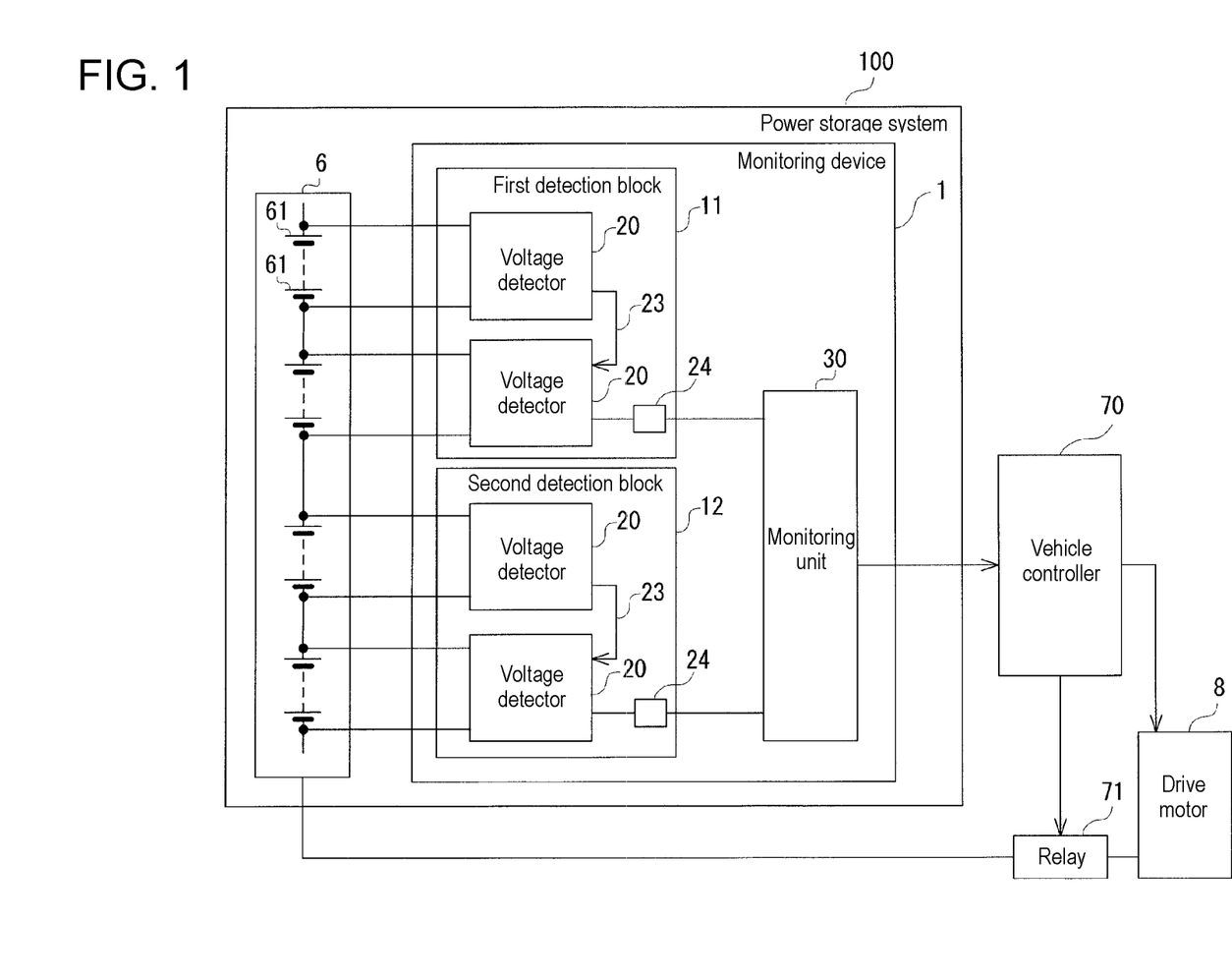
FIG. 1 is a block diagram illustrating a configuration of a power storage system according to an exemplary embodiment.

FIG. 1 is a block diagram illustrating a configuration of power storage system 100 according to an exemplary embodiment. Power storage system 100 includes power storage unit 6 and monitoring device 1. Power storage unit 6 supplies electric power to drive motor 8 at the time of power running and receives supply of electric power from drive motor 8 at the time of regeneration. Power storage system 100 gives a report to vehicle controller 70 which indicates an abnormality of power storage unit 6, a failure of a circuit in a detection circuit system that detects a state of power storage unit 6, and a complement state of power storage unit 6. Based on the report from power storage system 100, vehicle controller 70 controls opening and closing of relay 71 and drives drive motor 8.

Power storage unit 6 includes a plurality of power storage cells 61, such as lithium ion battery cells, connected in series. Instead of a lithium ion battery cell, each power storage cell 61 may be a nickel hydride battery cell, a lead-acid battery cell, an electric double layer capacitor cell, or a lithium ion capacitor cell, for example.

Monitoring device 1 includes first detection block 11, second detection block 12, and monitoring unit 30. Each of first detection block 11 and second detection block 12 detects a state of a plurality of power storage cells 61 and transmits the detected state of power storage cells 61 to monitoring unit 30. FIG. 1 illustrates an example of detecting voltages of power storage cells 61.

Figure 2:
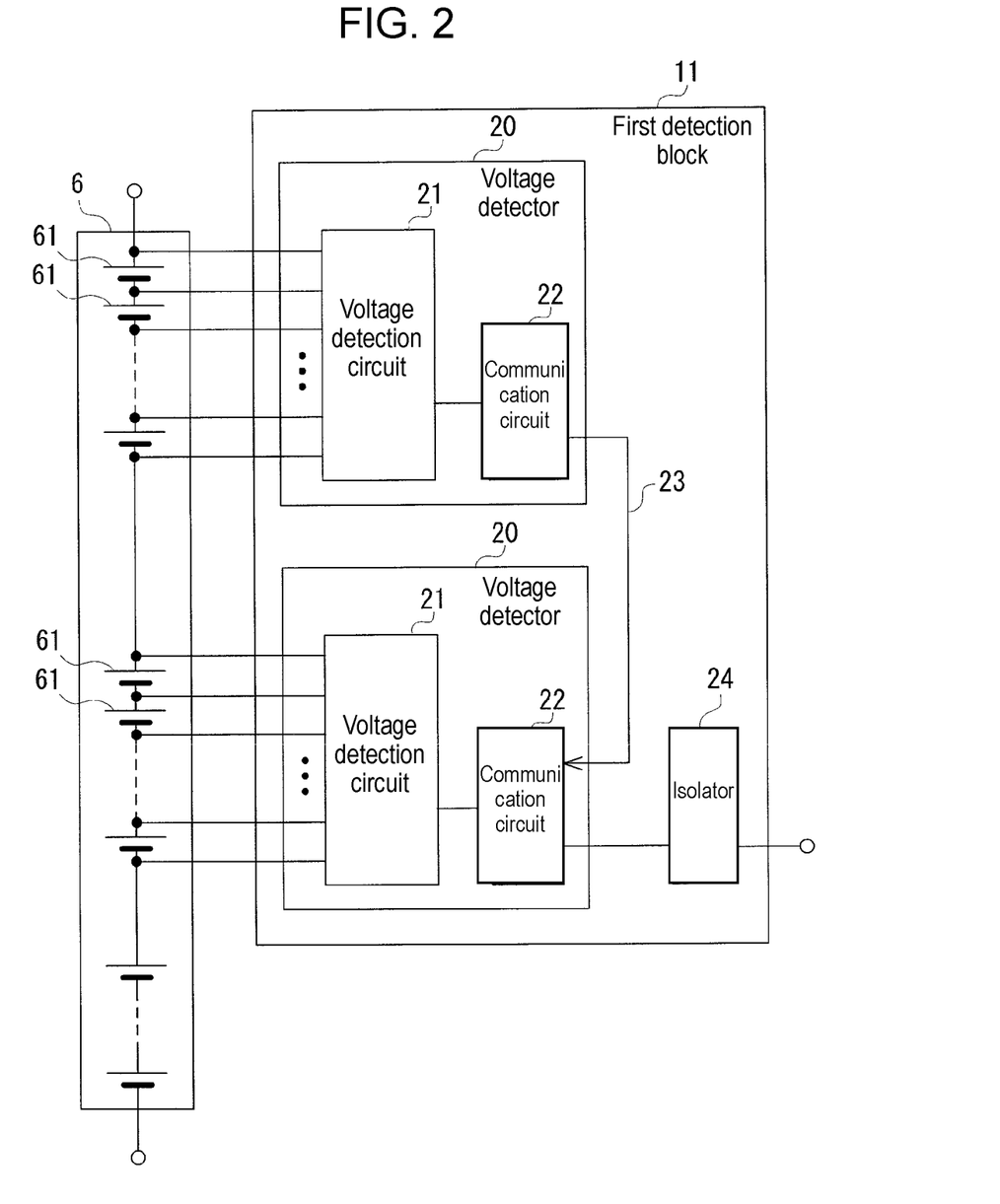
FIG. 2 is a block diagram illustrating a configuration of a first detection block.

First detection block 11 includes one or more voltage detectors 20 each of which detects a voltage across the plurality of power storage cells 61. In addition, first detection block 11 transmits detected voltage information on power storage cells 61 to monitoring unit 30. FIG. 2 is a block diagram illustrating a configuration of first detection block 11. Each of voltage detectors 20, which may be formed of an application specific integrated circuit (ASIC), for example, has voltage detection circuit 21 and communication circuit 22. Voltage detection circuit 21 detects a voltage across power storage cells 61. Communication circuit 22 transmits voltage information on power storage cells 61 detected by voltage detection circuit 21 to outside. Communication circuits 22 in respective voltage detectors 20 are cascade-connected to each other via signal lines 23. The voltage information on power storage cells 61 detected by first detection block 11 is transmitted from one voltage detector 20 to monitoring unit 30 via isolator 24. Communication circuit 22 is a circuit that communicates with the outside, for example, in accordance with a serial peripheral interface (SPI) scheme.

Second detection block 12 includes one or more voltage detectors 20 each of which detects a voltage across a plurality of power storage cells 61. In addition, second detection block 12 transmits detected voltage information on power storage cells 61 to monitoring unit 30. Second detection block 12 is similar in configuration to first detection block illustrated in FIG. 2. Thus, communication circuits 22 in respective voltage detectors 20 are cascade-connected to each other via signal lines 23. The voltage information on power storage cells 61 detected by second detection block 12 is transmitted from one voltage detector 20 to monitoring unit 30 via isolator 24.

Figure 3:
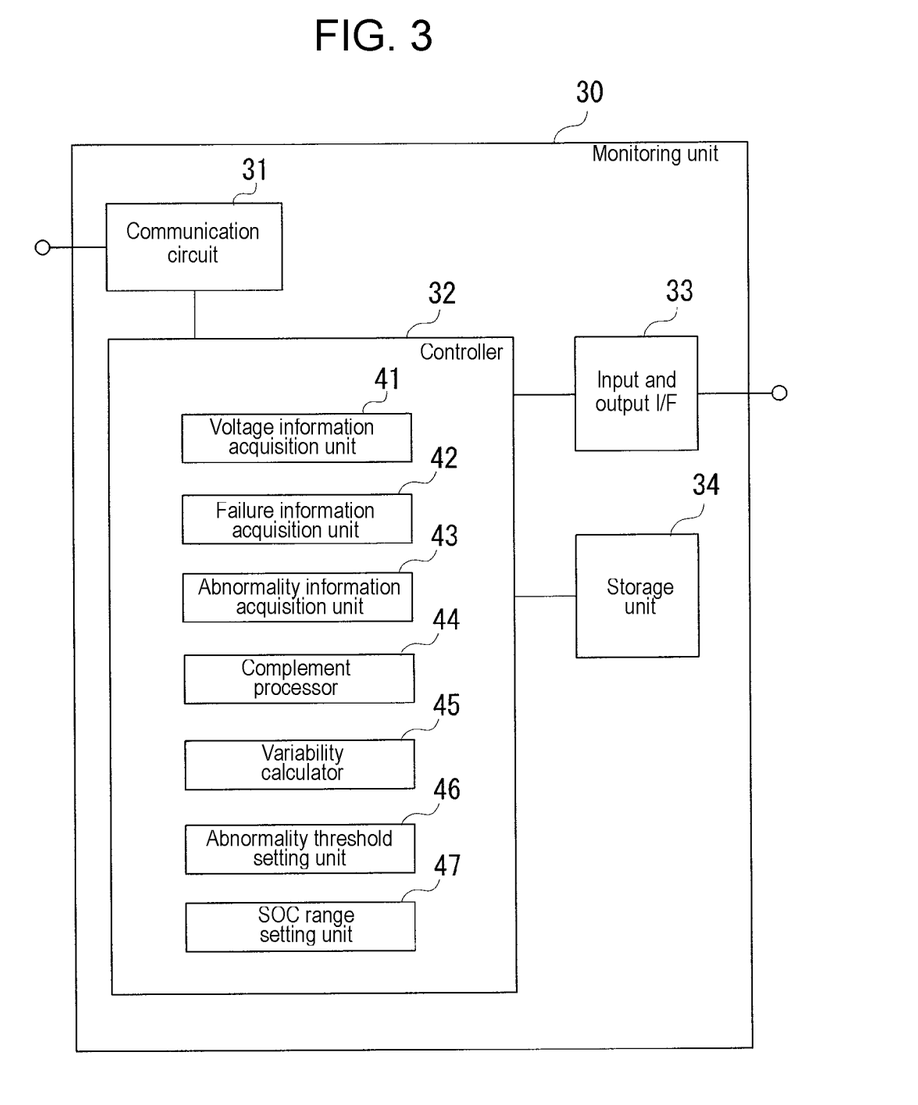
FIG. 3 is a block diagram illustrating a configuration of a monitoring unit.

FIG. 3 is a block diagram illustrating a configuration of monitoring unit 30. Monitoring unit 30 includes communication circuit 31, controller 32, input and output interface 33 (abbreviated as input and output I/F 33), and storage unit 34. Monitoring unit 30, which may be formed of a microcomputer, performs functions by executing programs stored in storage unit 34. Storage unit 34, which may be formed of a data storage circuit such as random access memory (RAM) or flash memory, stores process-related data in addition to the programs.

Communication circuit 31 acquires the voltage information on power storage cells 61 from both first detection block 11 and second detection block 12 via isolator 24. Communication circuit 31 is a circuit that communicates with the outside, for example, in accordance with the above SPI communication scheme. Input and output I/F 33 outputs various information on, for example, a failure of a circuit or an abnormality of a voltage to vehicle controller 70.

Controller 32 includes voltage information acquisition unit 41, failure information acquisition unit 42, abnormality information acquisition unit 43, complement processor 44, deviation calculator 45, abnormality threshold setting unit 46, and SOC range setting unit 47. Voltage information acquisition unit 41 acquires, via communication circuit 31, the voltage information on power storage cells 61 detected by both first detection block 11 and second detection block 12 and then stores the voltage information in storage unit 34.

Failure information acquisition unit 42 determines whether the communication circuit 31 has acquired the voltage information on power storage cells 61 from first detection block 11 or second detection block 12. If failing to acquire the voltage information on power storage cells 61, failure information acquisition unit 42 determines that communication circuit 22 in each block or a circuit in isolator 24 breaks down and acquires circuit failure information as a result of the determination. If data in the voltage information on power storage cells 61 acquired by voltage information acquisition unit 41 hovers at or near an upper or lower limit value that is allowable as the data, failure information acquisition unit 42 also determines that any failure occurs during data generation and acquires circuit failure information as a result of the determination.

Examples of a failure of a circuit in each voltage detector 20 in first detection block 11 and second detection block 12 include disconnection of a wire from power storage cells 61 and an error related to a voltage measurement accuracy. If each voltage detector 20 has a function of detecting a circuit failure as described above and transmits the circuit failure information via communication circuit 22, failure information acquisition unit 42 acquires this circuit failure information via communication circuit 31. Based on the acquired failure information, failure information acquisition unit 42 gives a report to vehicle controller 70 which indicates a failure of a circuit and a detection block containing this circuit.

Abnormality information acquisition unit 43 determines whether data in the voltage information on power storage cells 61 indicates that any abnormality occurs due to overcharging or over-discharging and then acquires abnormality information on presence or absence of an abnormality of the voltage. More specifically, abnormality information acquisition unit 43 compares data in the voltage information on power storage cells 61 with an overcharge threshold, which is an upper limit of a normal range of the voltage. If the data is higher than the overcharge threshold, abnormality information acquisition unit 43 acquires abnormality information indicating that any abnormality occurs in the voltage due to overcharging. Likewise, abnormality information acquisition unit 43 compares data in the voltage information on power storage cells 61 with an overdischarge threshold, which is a lower limit of the normal range of the voltage. If the data is lower than the overdischarge threshold, abnormality information acquisition unit 43 acquires abnormality information indicating that any abnormality occurs in the voltage due to over discharging.

If a circuit in either one of first detection block 11 and second detection block 12 breaks down, complement processor 44 complements the voltage information on power storage cells 61 detected by the detection block containing the broken circuit, based on the voltage information on power storage cells 61 detected by the detection block containing the normal circuit. More specifically, in order to complement the voltage information on power storage cells 61 detected by the detection block containing the broken circuit, complement processor 44 uses a variation level of the voltages across power storage cells 61; the variation level is acquired by deviation calculator 45, which will be described below, when both first detection block 11 and second detection block 12 are in a normal state.

When the circuits in both first detection block 11 and second detection block 12 are in a normal state and thus the voltage information on all power storage cells 61 is acquired, deviation calculator 45 calculates a difference between maximum and minimum values of the pieces of data in the voltage information on power storage cells 61 and designates this difference as the variation level.

Based on the variation level calculated by deviation calculator 45 when the circuit in either one of first detection block 11 and second detection block 12 breaks down, abnormality threshold setting unit 46 sets thresholds for use in determining that power storage cells 61 are in an abnormal state. More specifically, abnormality threshold setting unit 46 sets an upper threshold for use in determining that power storage cells 61 are in an abnormal state to a value obtained by subtracting the variation level from an overcharge threshold; the overcharge threshold is an upper limit of a normal range of the voltage when a circuit is in a normal state. Likewise, abnormality threshold setting unit 46 sets a lower threshold for use in determining that power storage cells 61 are in an abnormal state to a value obtained by adding the variation level to an overdischarge threshold; the overdischarge threshold is a lower limit of the normal range of the voltage when a circuit is in a normal state.

SOC range setting unit 47 varies an SOC usage range for power storage unit 6, based on the variation level calculated by deviation calculator 45. Alternatively, if a circuit in one of first detection block 11 and second detection block 12 breaks down, SOC range setting unit 47 may set a fixed range (for example, 10% range) to the SOC usage range, independently of the variation level calculated by deviation calculator 45.

Monitoring unit 30 gives a report to vehicle controller 70 which indicates an abnormality of the voltage across power storage cells 61, failures of the circuits in first detection block 11 and second detection block 12, a complement state of the voltage across power storage cells 61, and the SOC usage range, based on a process performed by controller 32 described above.

Next, an operation of monitoring device 1 will be described below.

If a circuit in one of first detection block 11 and second detection block 12 breaks down, monitoring unit 30 cannot acquire the voltage across power storage cells 61 from the detection block containing the broken circuit. In this case, monitoring unit 30 complements the voltage across power storage cells 61 from the detection block containing the broken circuit, based on the voltage information on power storage cells 61 acquired from the detection block containing a normal circuit and the variation level calculated by deviation calculator 45 when both first detection block 11 and second detection block 12 are in a normal state.

Figure 4:
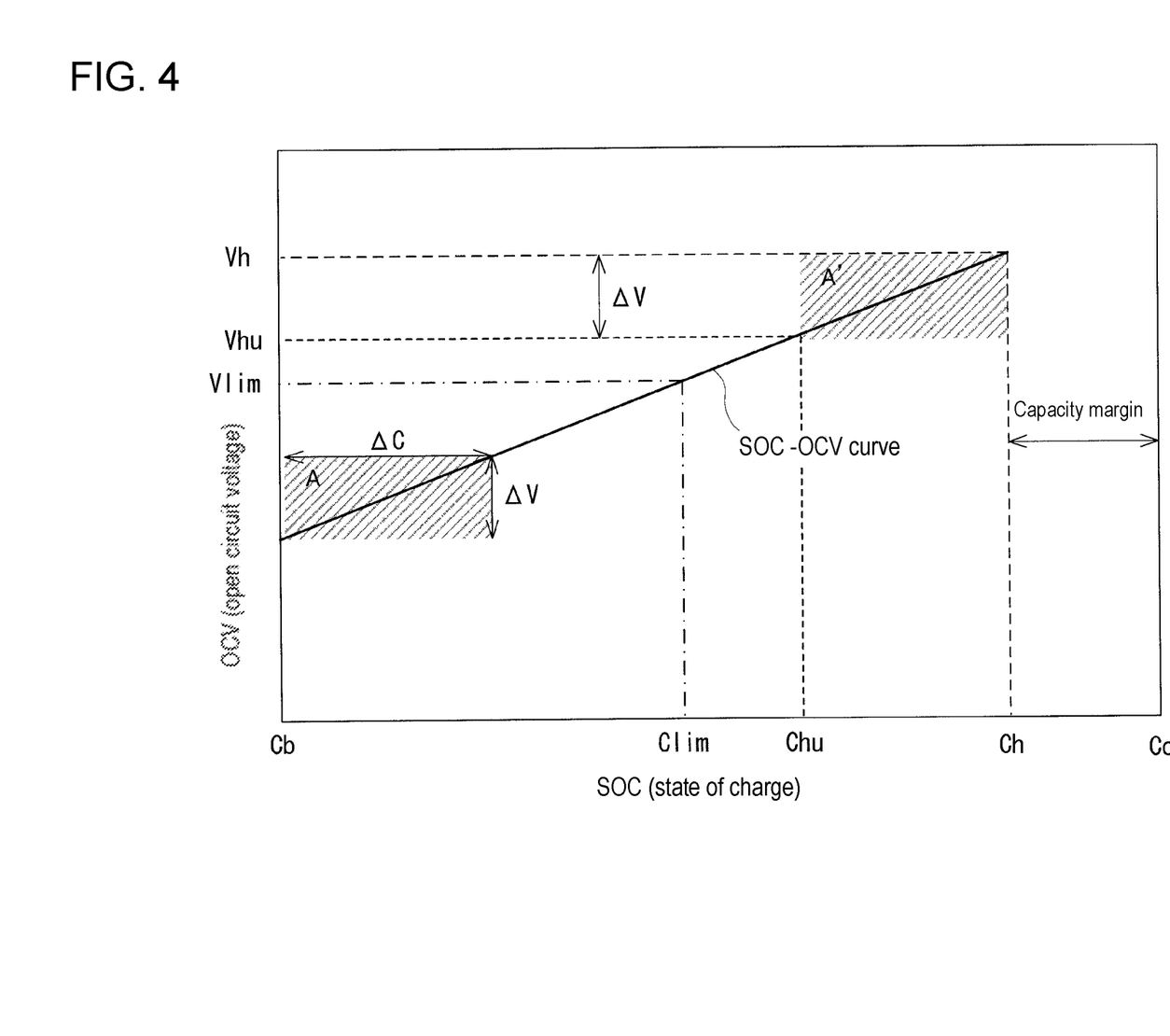
FIG. 4 is a graph illustrating an SOC (state of charge)-OCV (open circuit voltage) curve of a power storage cell and an example of setting in a case where a circuit breaks down.

FIG. 4 is a graph illustrating an SOC (state of charge)-OCV (open circuit voltage) curve of power storage cells 61 and an example of setting in a case where a circuit breaks down. In FIG. 4, Cb denotes an estimated start-up capacity, and a solid line represents the SOC-OCV curve of power storage cells 61. Co denotes a capacity when the power storage is an abnormal state (over-charged state), and Ch denotes a capacity limit line (=threshold), which has a value obtained by subtracting a capacity margin Cm from capacity Co.

The variation level of power storage cells 61 determined by deviation calculator 45 is denoted by ΔV. Monitoring unit 30 sets an overcharge threshold to voltage Vhu, the overcharge threshold is used to detect an abnormality of the voltage across power storage cells 61 when the circuit breaks down, and voltage Vhu is a value obtained by subtracting ΔV from cell voltage Vh related to capacity limit line (=threshold) Ch. In this case, capacity Chu of power storage cells 61 which is related to cell voltage Vhu is used as a current conduction stop line. In addition, for example, output limit line Cr, which is used to decrease a charge or discharge current to 0 A, may be provided on a negative side of the current conduction stop line.

When making the complement, complement processor 44 assumes that the voltage across power storage cells 61 for the detection block containing a broken circuit falls within any of regions A and A' (hatched regions in FIG. 4) when seen from the charging side; each of regions A and A' ranges from a voltage across power storage cells 61 acquired from the detection block containing a normal circuit to the sum of this voltage and the variation level ΔV. If the voltage across power storage cells 61 acquired from a detection block containing a normal circuit is lower than the overcharge threshold Vhu, the voltage across power storage cells 61 acquired from a detection block containing a broken circuit is likely to be lower than cell voltage Vh even in consideration of the variation level. Likewise, on the over-discharge side, complement processor 44 may also set an overdischarge threshold for use in determining that a circuit breaks down, in consideration of the variation level ΔV.

Complement processor 44 sets overcharge threshold Vhu based on variation level ΔV calculated by deviation calculator 45 and then complements a voltage across power storage cells 61 for a detection block containing a broken circuit, thereby protecting power storage unit 6. Consequently, even if a circuit in one of first detection block 11 and second detection block 12 breaks down, monitoring device 1 can continue to supply electric power to drive motor 8 with power storage unit 6 being protected. This can enhance running continuity (=vehicle operation endurance) of a vehicle.

Figure 5:
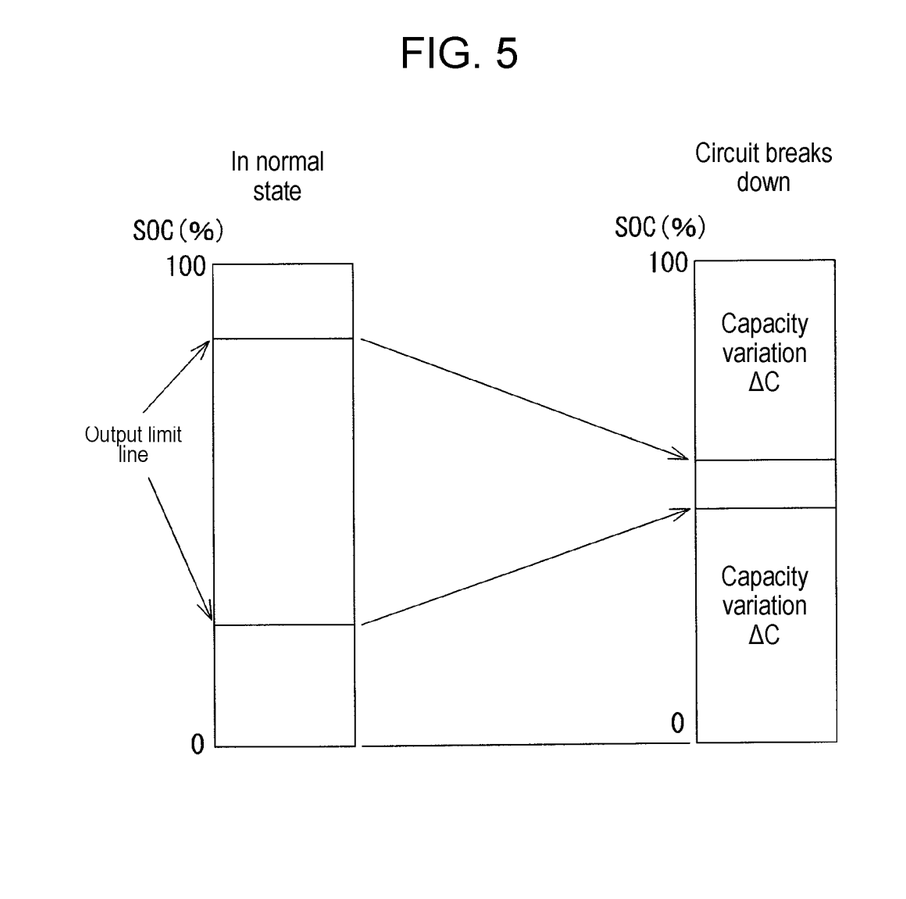
FIG. 5 is a schematic, explanatory view of an example of defining an SOC usage range in cases where the circuit is in a normal state and where the circuit breaks down.

FIG. 5 is a schematic, explanatory view of an example of defining an SOC usage range in cases where the circuit is in a normal state and where the circuit breaks down. SOC range setting unit 47 in monitoring unit 30 defines an SOC usage range between upper and lower output limit lines that have been preset upon a normal operation. On each of the output limit lines, for example, a charge or discharge current is decreased to 0 A. If a circuit in one of first detection block 11 and second detection block 12 breaks down, SOC range setting unit 47 defines the SOC usage range in consideration of capacity variation ΔC related to variation level ΔV calculated by deviation calculator 45. More specifically, when a circuit breaks down, SOC range setting unit 47 defines the SOC usage range by downwardly shifting upper output limit line for the normal operation by capacity variation ΔC and by upwardly shifting the lower output limit line for the normal operation by capacity variation ΔC.

SOC range setting unit 47 may define the SOC usage range so as to contain about 10% range between ranges considering capacity variation ΔC as described above. By defining the SOC usage range in this manner, monitoring device 1 can reserve a capacity margin required to protect power storage unit 6 in consideration of a variation in a voltage across power storage cells 61.

Figure 6:
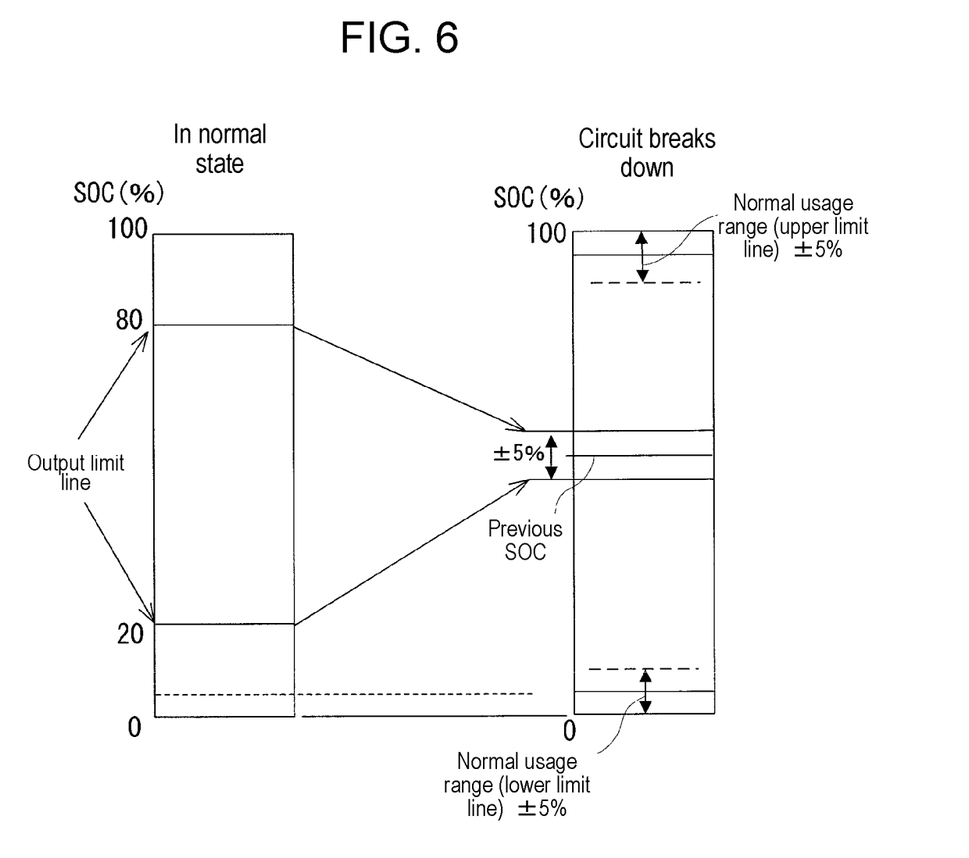
FIG. 6 is a schematic, explanatory view of another example of defining an SOC usage range in cases where the circuit is in a normal state and where the circuit breaks down.

FIG. 6 is a schematic, explanatory view of another example of defining an SOC usage range in cases where the circuit is in a normal state and where the circuit breaks down. SOC range setting unit 47 in monitoring unit 30 defines the SOC usage range so as to contain an SOC that has been obtained immediately before a circuit in one of first detection block 11 and second detection block 12 breaks down. In this case, SOC range setting unit 47 uses, as references, an upper limit line (for example, 95%) and a lower limit line (for example, 5%) of a normal usage range of the SOC, and sets the SOC usage range to a ±5% range of the previous SOC (=immediately-before SOC). SOC range setting unit 47 reserves a margin for overcharging and over-discharging in consideration of the complement using variation level ΔV calculated by deviation calculator 45.

Figure 7:
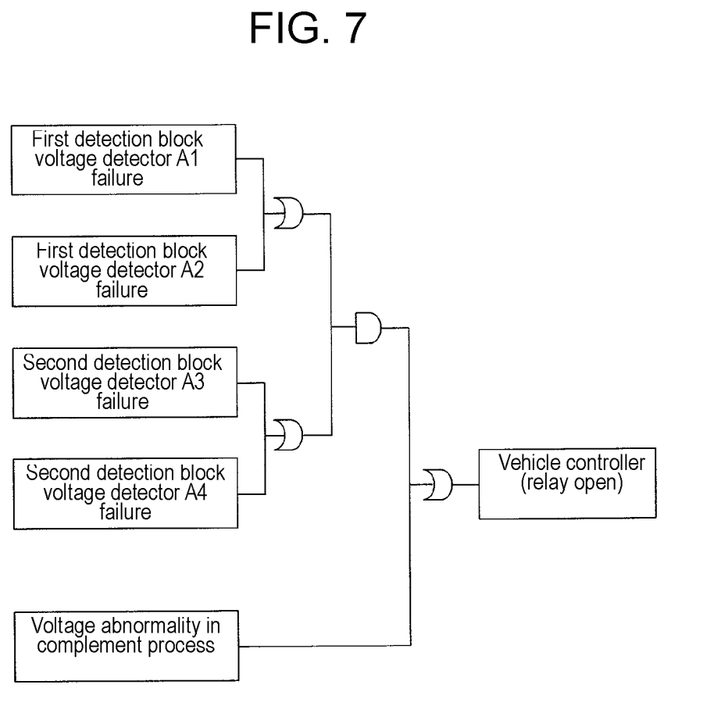
FIG. 7 is a schematic, explanatory view of a logic calculation used for a vehicle controller to open or close a relay.

FIG. 7 is a schematic, explanatory view of a logic calculation used for vehicle controller 70 to open or close a relay. For convenience, voltage detectors 20 contained in first detection block 11 are denoted by A1 and A2, and voltage detectors 20 contained in second detection block 12 are denoted by A3 and A4. Vehicle controller 70 acquires a logical sum of circuit failures in voltage detectors A1 and A2 contained in first detection block 11 and also acquires a logical sum of circuit failures in voltage detectors A3 and A4 contained in second detection block 12. Vehicle controller 70 calculates a logical product of these resultant logical sums and determines whether to report a circuit failure. Then, vehicle controller 70 acquires a logical sum of the result of the determination whether to report the circuit failure and a complement process for a voltage abnormality in a complement process performed by monitoring device 1 upon a circuit failure.

Figure 8:
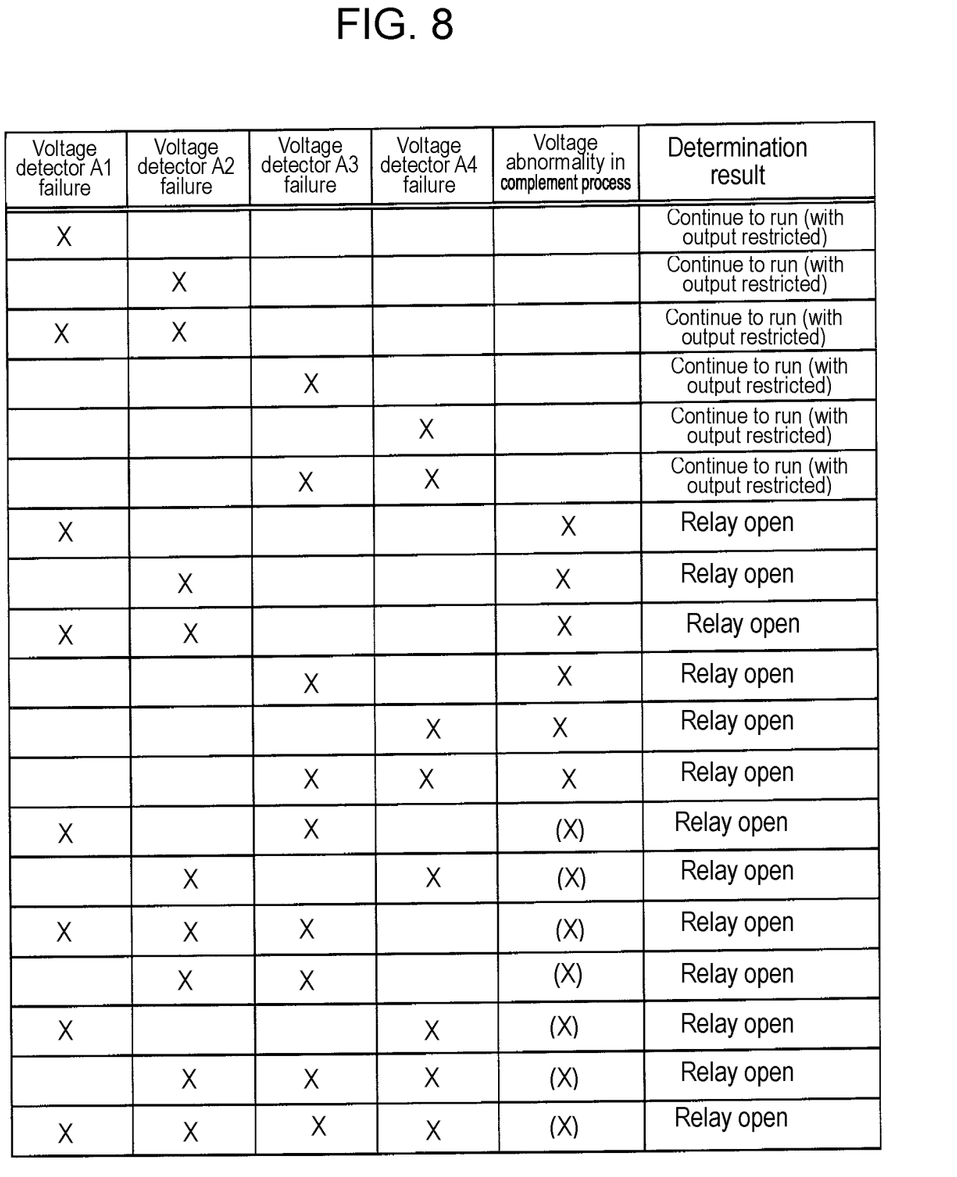
FIG. 8 is a chart illustrating a result of the logic calculation used for the vehicle controller to open or close the relay.

FIG. 8 is a chart illustrating a result of the logic calculation used for vehicle controller 70 to open or close the relay. When one of first detection block 11 and second detection block 12 is in a normal state, if monitoring device 1 determines that the voltage is in a normal state during the complement process, vehicle controller 70 determines that the vehicle should continue to run with an output restricted. When one of first detection block 11 and second detection block 12 is in a normal state, if monitoring device 1 determines that the voltage is in an abnormal state (=X) during the complement process, vehicle controller 70 opens relay 71 to break an electrical connection between power storage unit 6 and drive motor 8.

If both circuits in first detection block 11 and second detection block 12 break down, vehicle controller 70 opens relay 71 to break the electrical connection between power storage unit 6 and drive motor 8, independently of the determination made by monitoring device 1 whether the voltage is in an abnormal state during the complement process. As described above, when one of first detection block 11 and second detection block 12 is in a normal state, if monitoring device 1 determines that the voltage is in a normal state during the complement process, vehicle controller 70 determines that the vehicle should continue to run. This enhances vehicle continuity of the vehicle.

(Modification)

Figure 9:
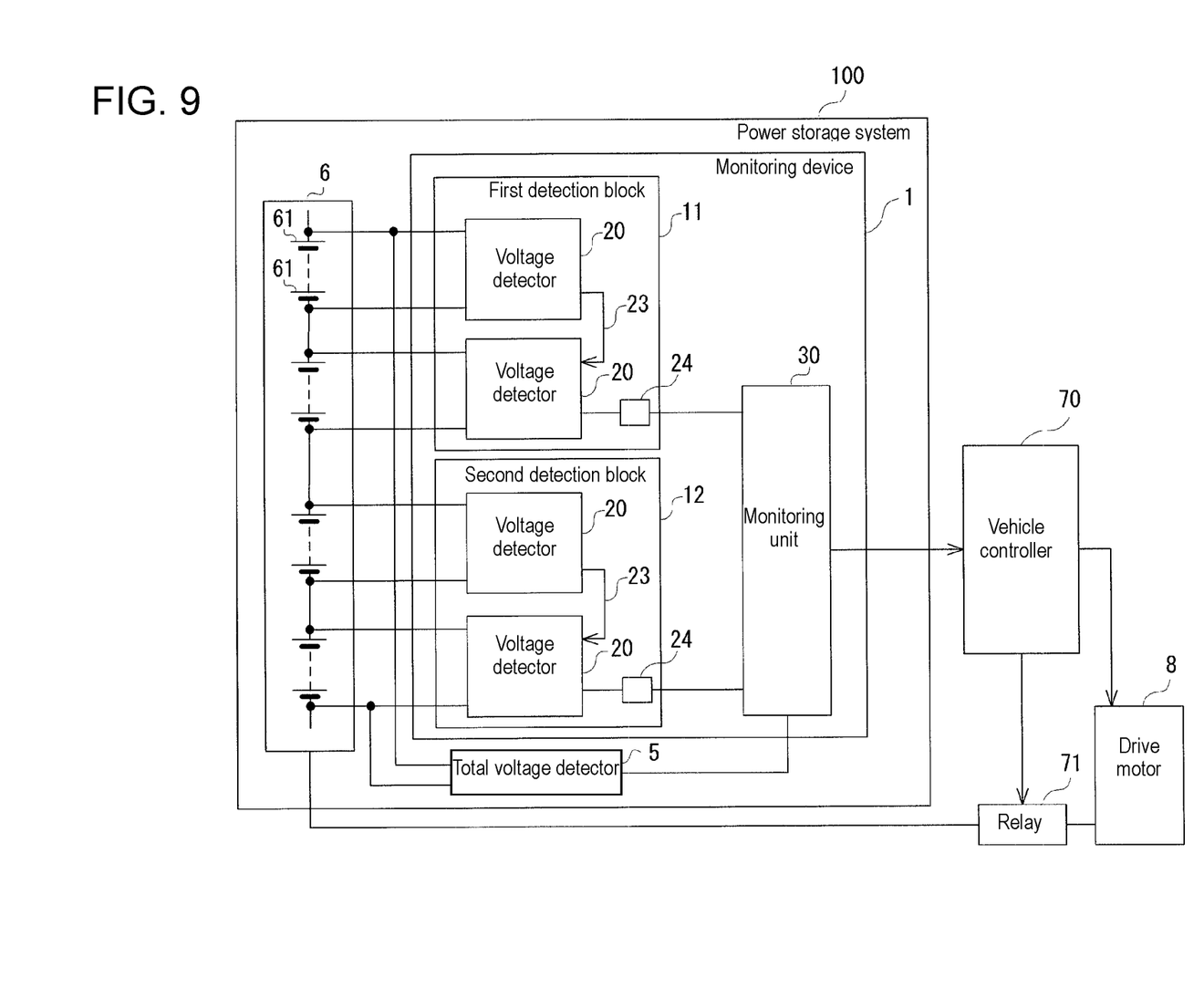
FIG. 9 is a block diagram illustrating a configuration of a power storage system according to a modification.

FIG. 9 is a block diagram illustrating a configuration of power storage system 100 according to a modification. Power storage system 100 according to this modification includes total voltage detector 5 that detects a total voltage across power storage unit 6. Total voltage detector 5 detects a voltage between terminals of entire power storage unit 6 and outputs the detected voltage to monitoring unit 30. If a circuit in one of first detection block 11 and second detection block 12 breaks down, monitoring unit 30 complements a voltage across power storage cells 61 for the detection block containing the broken circuit, based on voltage information on power storage cells 61 from the detection block containing a normal circuit and the total voltage acquired from total voltage detector 5.

Monitoring unit 30 complements the total voltage across power storage cells 61 for the detection block containing the broken circuit by subtracting a sum of values of power storage cells 61 acquired from a detection block containing a normal circuit from the total voltage acquired from total voltage detector 5. If the complemented total voltage across power storage cells 61 for the detection block containing the broken circuit has an abnormal value, monitoring unit 30 gives a report to vehicle controller 70 which indicates that a voltage is in an abnormal state.

In the foregoing exemplary embodiment and modification, the description has been given using a voltage across power storage cells 61 as a state of power storage cell 61. However, as an alternative example, the temperature of power storage cells 61 may be used as the state of power storage cells 61 if a temperature of power storage cells 61 is detected. Furthermore, deviation calculator 45 uses a difference between maximum and minimum values as a variation level. However, deviation calculator 45 may use a value, such as a deviation value, determined by a statistical method.

In the foregoing exemplary embodiment and modification, the description has been given using two detection blocks, or first detection block 11 and second detection block 12. However, two or more detection blocks may be used. Moreover, each detection block may contain one or two or more voltage detectors 20.

The present invention has been described based on the exemplary embodiment. However, those skilled in the art can understand that the exemplary embodiment is an example, and various modifications and variations are possible within the scope of the present invention so that these modifications and variations fall within the scope of the claims of the present invention. Therefore, the description and figures herein should be interpreted as being illustrative, not limitative.

The exemplary embodiment and modification may also be specified by the following items.

[Item 1]

Monitoring device (1) including: first detection block (11); second detection block (12), each of first detection block (11) and second detection block (12) including one or more state detectors (20) that detect states of power storage cells (61) inside power storage unit (6) mounted in a vehicle; and monitoring unit (30) that acquires the states of the power storage cells (61) detected in each of first detection block (11) and second detection block (12), the monitoring unit (30) including complement processor (44) that, when a circuit in first detection block (11) breaks down and first detection block (11) fails to transmit the states of power storage cells (61) to monitoring unit (30), complements the states of power storage cells (61) that have not been acquired from first detection block (11), based on the states of power storage cells (61) detected in second detection block (12). With this configuration, monitoring device (1) can complement the states of power storage cells (61) which have not been acquired from first detection block (11), thereby successfully enhancing running continuity (=vehicle operation endurance) of the vehicle.

[Item 2]
Monitoring device (1) according to Item 1, in which each of first detection block (11) and second detection block (12) transmits the states of power storage cells (61) detected by state detectors (20) inside to monitoring unit (30) via communication circuit (22) possessed by one of state detectors (20). With this configuration, monitoring device (1) can monitor power storage cells (61) in units of detection blocks.

[Item 3]
Monitoring device (1) according to Item 1 or 2, in which state detectors (20) detect voltages across a plurality of power storage cells (61) connected in series inside power storage unit (6), monitoring device (1) further includes total voltage detector (5) that detects a total voltage across the plurality of power storage cells connected in series, and complement processor (44) complements the states of power storage cells (61) that have not been acquired from first detection block (11), based on the total voltage detected by total voltage detector (5). With this configuration, monitoring device (1) can complement the states of power storage cells (61) that have not been acquired from first detection block (11), based on the total voltage of power storage unit (6).

[Item 4]
Monitoring device (1) according to Item 1 or 2, in which monitoring unit (30) includes deviation calculator (45) that calculates a variation level of the states of the plurality of power storage cells (61) acquired from both first detection block (11) and second detection block (12), and the complement processor (44) complements the states of power storage cells (61) that have not been acquired from first detection block (11), based on the variation level calculated by deviation calculator (45). With this configuration, monitoring device (1) can complement the states of power storage cells (61) that have not been acquired from first detection block (11).

[Item 5]
Monitoring device (1) according to Item 4, in which monitoring unit (30) includes abnormality threshold setting unit (46) that sets a threshold, based on the variation level calculated by deviation calculator (45), the threshold indicating an abnormality of power storage cells (61). With this configuration, monitoring device 1 can protect power storage unit (6).

[Item 6]
Monitoring device (1) according to Item 4 or 5, in which monitoring unit (30) includes state of charge (SOC) range setting unit (47) that defines an SOC usage range for power storage unit (6), and SOC range setting unit (47) varies the SOC usage range for power storage unit (6), based on the variation level calculated by deviation calculator (45). With this configuration, monitoring device (1) can protect power storage unit (6) by restricting the SOC usage range.

[Item 7]
Monitoring device (1) according to Item 4 or 5, in which monitoring unit (30) includes SOC range setting unit (47) that defines an SOC usage range for power storage unit (6), and SOC range setting unit (47) defines the SOC usage range that contains an SOC that has been obtained immediately before the circuit in first detection block (11) breaks down. With this configuration, monitoring device (1) protects power storage unit (6) by restricting the SOC usage range without rapidly varying the SOC.

[Item 8]
Power storage system (100) including: power storage unit (6); and monitoring device (1) according to one of Items 1 to 7. With this configuration, power storage system (100) can complement the state of power storage cells (61) which have not been acquired from first detection block (11), successfully enhancing running continuity (=vehicle operation endurance) of a vehicle.

The invention claimed is:
1. A monitoring device comprising:
a first detection block;
a second detection block, each of the first detection block and the second detection block including one or more state detectors that detect states of power storage cells inside a power storage unit mounted in a vehicle; and
a monitoring unit that acquires the states of the power storage cells detected in each of the first detection block and the second detection block,
the monitoring unit including a complement processor that, when a circuit in the first detection block breaks down and the first detection block fails to transmit the states of the power storage cells to the monitoring unit, complements the states of the power storage cells that have not been acquired from the first detection block, based on the states of the power storage cells detected in the second detection block.

2. The monitoring device according to claim 1, wherein each of the first detection block and the second detection block transmits the states of the power storage cells detected by the state detectors inside to the monitoring unit via a communication circuit possessed by one of the state detectors.

3. The monitoring device according to claim 1, wherein
the state detectors detect voltages across a plurality of power storage cells connected in series inside the power storage unit,
the monitoring device further comprises a total voltage detector that detects a total voltage across the plurality of power storage cells connected in series, and
the complement processor complements the states of the power storage cells that have not been acquired from the first detection block, based on the total voltage detected by the total voltage detector.

4. The monitoring device according to claim 1, wherein
the monitoring unit includes a deviation calculator that calculates a variation level of the states of the plurality of power storage cells acquired from both the first detection block and the second detection block, and
the complement processor complements the states of the power storage cells that have not been acquired from the first detection block, based on the variation level calculated by the deviation calculator.

5. The monitoring device according to claim 4, wherein the monitoring unit includes an abnormality threshold setting unit that sets a threshold, based on the variation level calculated by the deviation calculator, the threshold indicating an abnormality of the power storage cells.

6. The monitoring device according to claim 4, wherein
the monitoring unit includes a state of charge (SOC) range setting unit that defines an SOC usage range for the power storage unit, and
the SOC range setting unit varies the SOC usage range for the power storage unit, based on the variation level calculated by the deviation calculator.

7. The monitoring device according to claim 4, wherein
the monitoring unit includes an SOC range setting unit that defines an SOC usage range for the power storage unit, and the SOC range setting unit defines the SOC usage range that contains an SOC that has been obtained immediately before the circuit in the first detection block breaks down.

8. A power storage system comprising:
a power storage unit; and
the monitoring device according to claim 1.

9. The monitoring device according to claim 5, wherein
the monitoring unit includes an SOC range setting unit that defines an SOC usage range for the power storage unit, and
the SOC range setting unit defines the SOC usage range that contains an SOC that has been obtained immediately before the circuit in the first detection block breaks down.

* * * * *